United States Patent
Nishikawa et al.

(10) Patent No.: US 7,234,984 B2
(45) Date of Patent: Jun. 26, 2007

(54) LIGHT ATTENUATION IN DEFECTIVE PIXEL IN ORGANIC EL PANEL

(75) Inventors: Ryuji Nishikawa, Gifu (JP); Yushi Jinno, Gifu (JP); Takashi Ogawa, Gifu (JP); Ryouzou Nagata, Bisai (JP)

(73) Assignee: Sanyo Electric Co., Ltd. (JP)

( * ) Notice: Subject to any disclaimer, the term of this patent is extended or adjusted under 35 U.S.C. 154(b) by 130 days.

(21) Appl. No.: 10/392,258

(22) Filed: Mar. 19, 2003

(65) Prior Publication Data
US 2003/0222861 A1 Dec. 4, 2003

(30) Foreign Application Priority Data
Mar. 20, 2002 (JP) .............................. 2002-078326
Mar. 20, 2002 (JP) .............................. 2002-078427
Jan. 21, 2003 (JP) .............................. 2003-012381

(51) Int. Cl.
*H01J 9/50* (2006.01)
*G02F 1/00* (2006.01)

(52) U.S. Cl. ........................... 445/2; 313/504; 428/690; 428/917; 349/192

(58) Field of Classification Search ........ 313/504–512; 315/169.3, 169.1; 349/54, 55, 192; 428/690, 428/917; 445/2
See application file for complete search history.

(56) References Cited

U.S. PATENT DOCUMENTS 5,792,561 A * 8/1998 Whang et al. .............. 428/457
6,219,113 B1 * 4/2001 Takahara ..................... 349/42
6,573,650 B2 6/2003 Aoki et al.
6,628,355 B1 * 9/2003 Takahara .................... 349/106
6,650,047 B2 11/2003 Aoki et al.
6,747,728 B2 * 6/2004 Nagayama .................. 349/192
6,778,233 B2 * 8/2004 Matsuura et al. ............. 349/54

FOREIGN PATENT DOCUMENTS

JP 2000195677 A * 7/2000

OTHER PUBLICATIONS

Office Action for corresponding Korean Patent Application No. 10-2003-0017084 with excerpt English translation.
Korean Patent Laid-Open Publication No. 2001-85420 and English abstract.
Machine translation of detailed description of JP patent application No. 2000-95677.

* cited by examiner

*Primary Examiner*—Karabi Guharay
(74) *Attorney, Agent, or Firm*—Cantor Colburn LLP (57) ABSTRACT

An organic EL element of one pixel is selectively irradiated with laser light. With the laser irradiation, the functionality of the organic layer of the organic EL element is selectively degraded and the light emission capability is removed without damaging the cathode.

5 Claims, 9 Drawing Sheets

LIGHT ATTENUATION IN DEFECTIVE PIXEL IN ORGANIC EL PANEL

BACKGROUND OF THE INVENTION

1. Field of the Invention

The present invention relates to the repair of a defective pixel in an organic electroluminescence (referred to simply as "EL" hereinafter) panel.

2. Description of the Related Art

Conventionally, organic EL display panels have been known as one type of flat display panel. Unlike liquid crystal display (LCD) panels, the organic EL display panels are self-emissive and commercialization of the organic EL display panels as clear and bright displays are highly expected.

An organic EL display is constructed by arranging a plurality of pixels each having an organic EL element in a matrix form. As a method for driving the organic EL element, similar as in LCDs, a passive method and an active method are known. Of these, also similar to the case with LCDs, the active matrix method is more desirable. That is, an active matrix method in which a switching element is provided for each pixel and the display in each pixel is controlled by controlling the switching element is more advantageous than a passive method which does not have a switching element in each pixel, because the active matrix method allows for realization of a display of a higher resolution.

Figure 11:
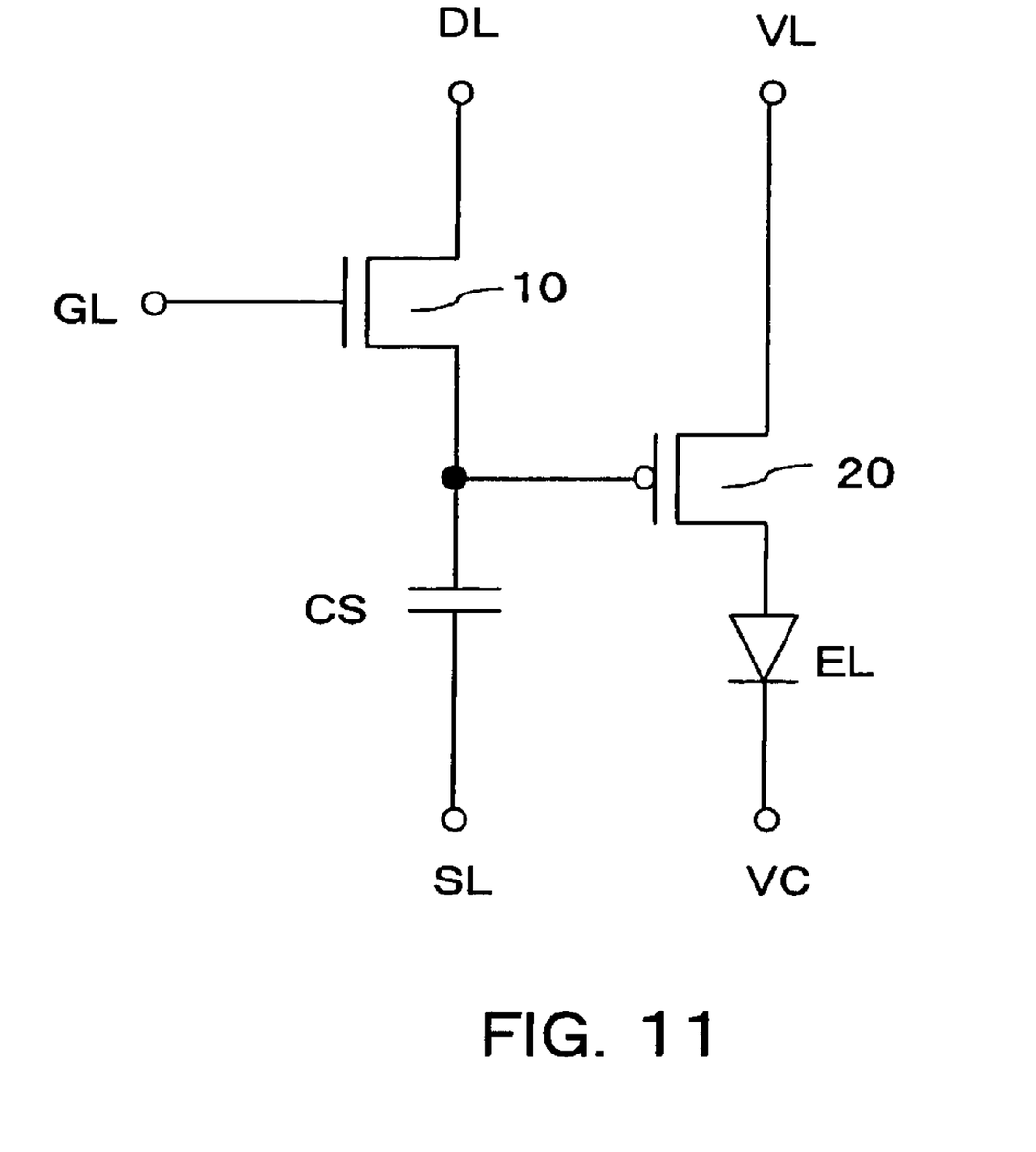
FIG. 11 is a diagram showing a structure of a pixel circuit.

In an LCD, one switching element (TFT) is used and is directly connected to a pixel electrode. In an organic EL panel, on the other hand, two TFTs and one capacitor are used. FIG. 11 shows an example structure of a pixel circuit in a conventional organic EL panel which uses thin film transistors (TFT). An organic EL panel is constructed by arranging such pixels in a matrix form.

A gate of a first TFT 10 which is an n channel thin film transistor selected by a gate line GL is connected to the gate line GL extending in the row direction. A drain of the first TFT 10 is connected to a data line DL extending in the column direction and a source of the first TFT 10 is connected to a storage capacitor CS whose other terminal is connected to a capacitance line SL which is a low potential power supply. The connection point between the source of the first TFT 10 and the storage capacitor CS is connected to a gate of a second TFT 40 which is a p channel thin film transistor. A source of the second TFT 40 is connected to a power supply line VL and a drain of the second TFT 40 is connected to an organic EL element EL. The other terminal of the organic EL element EL is connected to a cathode power supply CV.

In this structure, when the gate line GL is high (H level), the first TFT 10 is switched on and data on the data line DL is stored in the storage capacitor CS. An electric current in the second TFT 40 is controlled according to the data (potential) maintained in the storage capacitor CS, an electric current flows through the organic EL element EL according to the electric current in the second TFT 40, and light is emitted.

Whenever the first TFT 10 is switched on, a video signal corresponding to the pixel is supplied to the data line DL. The storage capacitor is then charged according to the video signal supplied to the data line DL, the second TFT 40 causes a corresponding electric current to flow, and the brightness of the organic EL element EL is controlled. The electric current flowing through the organic EL element EL is controlled by controlling the gate potential of the second TFT 40 and a gradation display for each pixel can be achieved.

In such an organic EL panel, a defect may occur in the first TFT 10 or the second TFT 40 provided for each pixel. If the defect is such that the electric current to the organic EL element is fixed at the "off" state, the pixel becomes a continuously dark point. Such a dark point is relatively not problematic because it is difficult for an observer to recognize one dark point among surrounding pixels that are normally emitting light. On the other hand, if the defect of the TFT is such that the electric current to the organic EL element is fixed at the "on" state, this pixel becomes a bright point. A bright point is conspicuous, even when only one bright point is present among surrounding pixels displaying black, and the bright point is therefore viewed as a serious deficiency. Therefore, conventionally, processes for darkening the defective pixel which became a bright point are applied.

In other words, an organic EL panel with a predetermined number of dark points is not considered problematic as a product, and the yield can be significantly improved by attenuating light of the bright point.

The darkening process can be performed by, for example, severing the wiring to the pixel. That is, similar to the LCDs, a method can be considered wherein the wiring between the second TFT 40 and the power supply line or between the second TFT 40 and the pixel electrode is cut using a YAG laser or the like.

By such a process, it is possible to address the problem of perceivable display quality by darkening the bright points.

However, when a darkening process using a YAG laser is applied, the cathode is damaged and display of other pixels may be affected. Specifically, in an active matrix organic EL panel, a TFT is formed on a glass substrate, an ITO anode is formed above the TFT, one or more organic layers such as a hole transport layer, an organic emissive layer, and an electron transport layer are layered on the ITO anode, and a metal cathode is formed on the organic layers. As described, a portion of the organic layers and the cathode are present above the TFT. In particular, the cathode is provided as a common electrode and formed over almost the entire surface of the panel.

With such a structure, when the wiring to the TFT is severed using a YAG laser, the laser may reach the cathode, causing ablation in the cathode and creating a hole in the corresponding section of the cathode. In addition, the ablation alters the characteristics of the cathode and the display of the surrounding pixels may also be affected. Furthermore, because the cutting process using a laser is a process in which the material present at the site is evaporated and removed, the side surfaces of the organic layers of the organic EL element become directly exposed to the environment above the cathode. Presence of such an exposed section increases the tendency for degradation of the organic layers by intrusion of moisture or the like, and may lead to formation of additional defective pixels.

SUMMARY OF THE INVENTION

The present invention relates to a method for effectively attenuating light in a defective pixel in an organic EL panel.

According to one aspect of the present invention, the light emitting capability of an organic EL element in a region of a defective pixel in an organic EL panel is degraded so that the light is attenuated.

More specifically, the characteristics of the organic layer of the defective pixel is altered by irradiation of laser light or the like so that the light emitting capability is degraded and the light is attenuated. Unlike in the process of severing the wiring using laser, the cathode is not damaged, which allows for attenuation of light in the bright point defective pixel without any adverse effect of damaged cathode. It is considered that the alteration of characteristics of the organic matter by irradiation of laser is caused by an increase in the resistance of the organic layers through fusion of the plurality of organic layers with each other as a result of the thermal energy supplied by the laser accompanied by the loss of the layered structure.

DESCRIPTION OF PREFERRED EMBODIMENTS

Preferred embodiments of the present invention (hereinafter referred to simply as "embodiments") will now be described with reference to the drawings.

In an embodiment, a defective pixel is irradiated with laser light using an UV (short wavelength) laser, such as an excimer laser, as a light source. With the irradiation of laser light, the characteristics of the organic layer of the defective pixel is altered, the light emitting capability is degraded, and attenuation can be achieved. The alteration of the characteristics of the organic layer is considered as being caused by, for example, the thermal energy of the laser fusing each of a hole transport layer, an organic emissive layer, and an electron transport layer, resulting in a loss of the layered structure.

Specifically, the irradiated laser is not sufficiently intense to evaporate the irradiated layer, and a thermal alteration of the characteristics occurs in the organic layer absorbing the laser light in a very short time, resulting in disabling of the light emitting capability and attenuation of light.

In particular, there is no damage to the cathode because the laser is not of sufficient energy to damage the cathode. Therefore, attenuation of the bright point defective pixel can be achieved without any adverse effect as would result from damage to the cathode.

The organic material in an organic EL element is vulnerable to heat or the like and the light emitting capability tends to degrade. In the present embodiment, by irradiating the organic layer of the element with laser light, a reaction similar to the degradation is promoted so that light is attenuated. It is considered that the annealing of the organic layer by the laser irradiation causes the degradation in the hole transporting capability, electron transporting capability, and/or light emitting capability of the organic emissive material. It may also be considered that the molecular structure itself does not change, but the film structure is altered. A typical display defect caused by alteration of characteristics of the organic layer normally spreads with elapse of time. However, when attenuation is achieved by laser irradiation as in the present embodiment, there is substantially no spread of the attenuated region outside the region irradiated by the laser. Therefore, a defect can be more reliably repaired while preserving high display quality.

Known YAG lasers include those of wavelengths of 266 nm, 355 nm, 532 nm, 1064 nm, and others. Of these lasers of various wavelengths, the YAG laser of 266 nm cannot transmit through a planarization film made of a material such as acryl and is not effective. With the YAG laser of 532 nm or greater, on the other hand, the advantage of the present invention can only be obtained by significantly increasing the power, and such an increase in power also affects the cathode.

A YAG laser of 355 nm is preferable because, with the YAG laser of 355 nm, it is possible to effectively degrade the light emission capability through alteration of the characteristics of the organic layer without affecting the cathode. In particular, when the hole transport layer, the organic emissive layer, and the electron transport layer fuse so that the layered structure is lost by the thermal energy of the laser and the light emission capability is degraded, there is substantially no effect on the cathode. In addition, an excimer laser having a wavelength of 308 nm is known which is also preferable.

Figure 1:
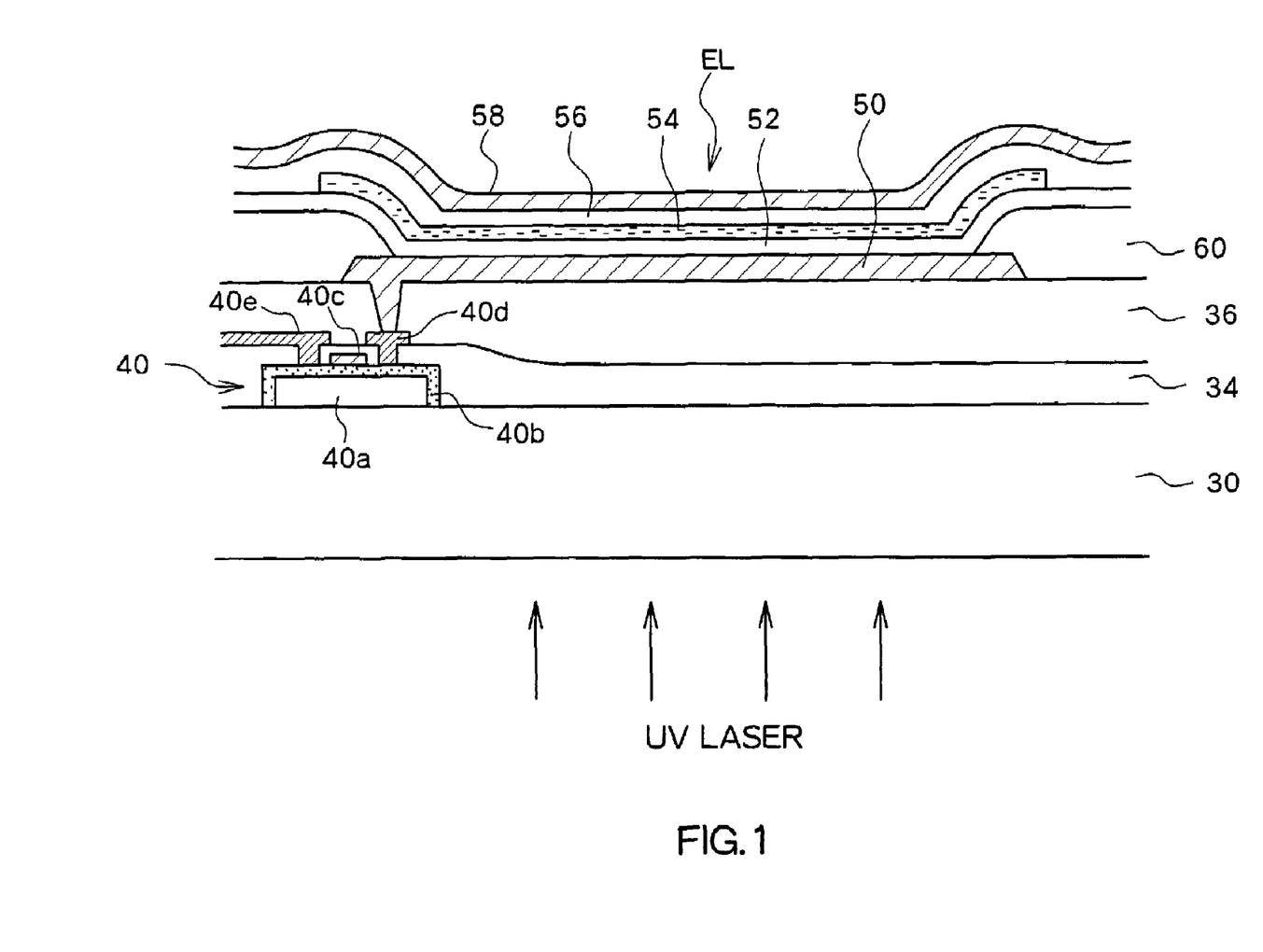
FIG. 1 is a diagram showing an example structure of a pixel.
Figure 6:
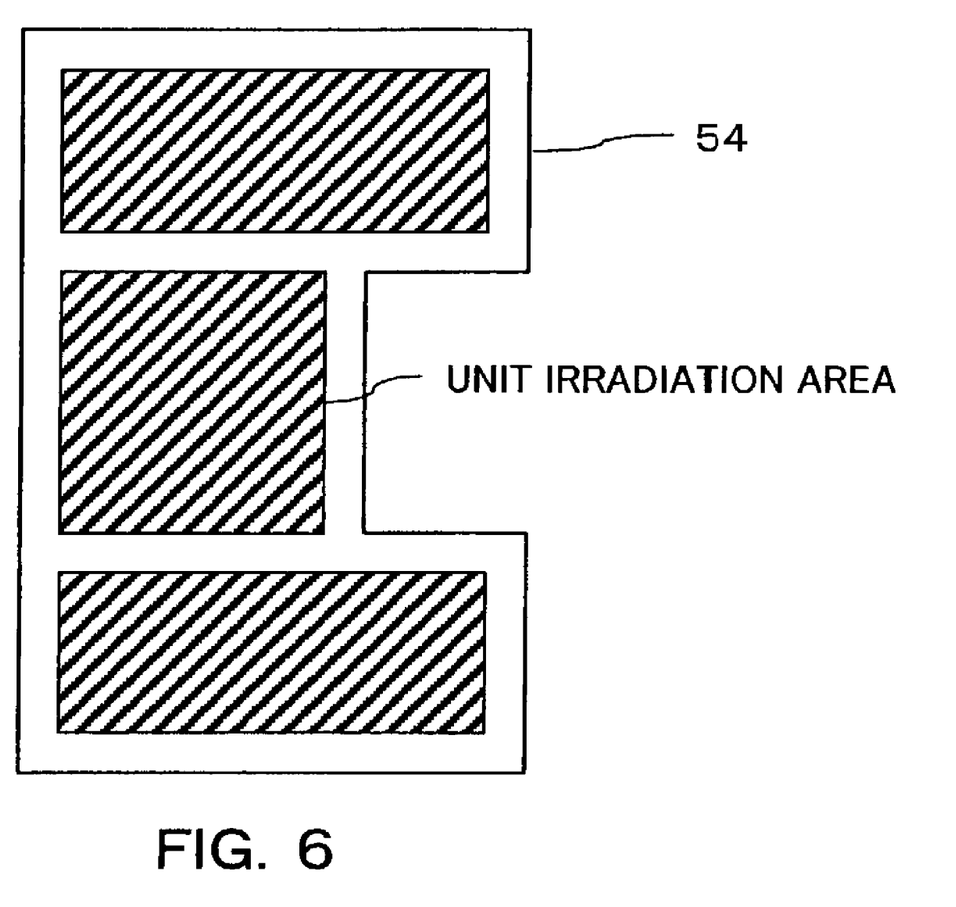
FIG. 6 is a diagram showing yet another example of a laser irradiation region.

FIG. 1 shows a structure of a pixel. With this structure, although the TFTs 10 and 40, capacitor CS, and organic EL element EL shown in FIG. 6 are formed in a pixel over an element substrate, FIG. 1 only shows the second TFT 40 and the organic EL element EL.

As shown in FIG. 1, the element substrate comprises a second TFT 40 formed on a glass substrate 30. The structures of the second TFT 40 and the organic EL element EL are shown. As shown in FIG. 1, the second TFT 40 is formed on the glass substrate 30 and comprises an active layer 40a formed of a low temperature polycrystalline silicon. The active layer 40a comprises a source region and a drain region, both of which are doped with impurities, on the ends of the active layer 40a. The central section between the source and the drain regions is a channel region. A gate electrode 40c is formed above the channel region with a gate insulation film 40b made of silicon oxide therebetween. The gate insulation film 40b and the gate electrode 40c are covered by an interlayer insulation film 34. A source electrode 40d and a drain electrode 40e which are respectively connected to the source region and the drain region through a contact hole formed in the interlayer insulation film 34 are formed on both sides of the gate electrode 40c. The upper ends of the source electrode 40d and the drain electrode 40e are placed on the surface of the interlayer insulation film 34.

On the surface of the interlayer insulation film 34, a metal wiring for connecting the drain electrode 40e and the power supply line VL, etc. is provided. In addition, a first planarization film 36 is formed covering the interlayer insulation film 34.

On the upper surface of the first planarization film 36 is formed a transparent electrode 50 made of ITO has and having one terminal connected to the source electrode 40*d* of the second TFT 40 through a contact hole formed in the first planarization film 36.

The transparent electrode 50 forms the anode of the organic EL element. A metal cathode 58 is formed above the transparent electrode 50 with a hole transport layer 52, an organic emissive layer 54, and an electron transport layer 56 therebetween. A second planarization film 60 is provided on the periphery and the sides of the transparent electrode 50. The organic emissive layer 54 is made larger than the transparent electrode 50 in order to accommodate positional deviation during formation and extends over the second planarization film 60, but not entirely covering the planarization film 60 so that the organic emissive layer 54 is formed only in the pixel region. The layers other than the organic emissive layer 54 such as the hole transport layer 52 and the electron transport layer 56 are formed over the entire surface. In some cases, however, the electron transport layer 56 may contain a light emitting material such as Alq3. Therefore, in many cases, the electron transport layer 56 is also limited in the light emitting section similar to the organic emissive layer 54. Here, as the hole transport layer 52, for example, a two-layered structure is employed which comprises a first hole transport layer made of MTDAT (4,4',4"-tris(3-methylphenylphenylamino)triphenylamine) and a second hole transport layer made of TPD (N,N'-diphenyl-N,N'-di(3-methylphenyl)-1,1'-biphenyl-4,4'-diamine). The organic emissive layer 54 is made of, for example, BeBq$_2$ (bis(10-hydroxybenzo[h]quinolinato)beryllium) containing a quinacridone derivative and the electron transport layer 56 is made of, for example, BeBq$_2$.

In such an organic EL panel, for the bright point defective pixel, a short wavelength laser is irradiated from the side of the glass substrate 30 to selectively damage the organic layer of the defective pixel and achieve attenuation.

Typically, a pulse laser is used as the laser, but, alternatively, a continuous laser may also be employed. The amount of irradiation depends of the type of the glass substrate and the materials of the organic layer and of the other layers. It is preferable that the amount of irradiation be experimentally determined as an amount that reliably allows for darkening of the bright point and that does not damage the cathode.

Figure 2:
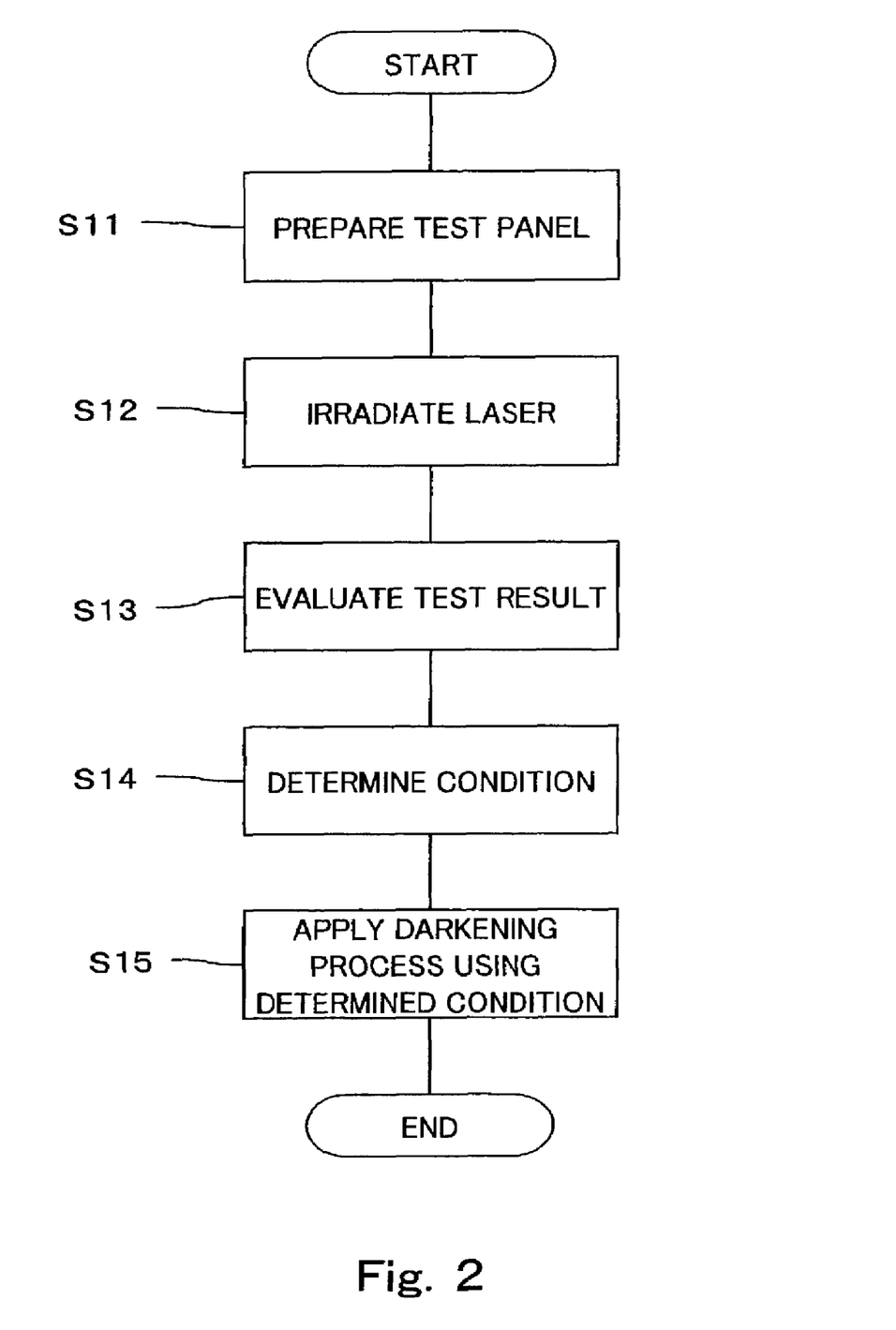
FIG. 2 is a flowchart showing an example process of setting an amount of irradiation of laser.

More specifically, as shown in FIG. 2, a test panel is prepared (S11) and laser light is irradiated to a plurality of pixels as the amount of irradiation varied (S12). The results of the laser irradiation experiments are evaluated (S13). That is, an evaluation is performed as to whether or not darkening is achieved and as to whether or not the cathode is damaged. From the evaluation, a condition for which the darkening can be reliably achieved and no damage is detected in the cathode (S14) can be found.

When a condition is determined in this manner, the condition is used for the darkening process of the bright point defective pixel in manufactured organic EL panels (S15).

As described, by irradiating laser light, it is possible to darken the target pixel without damaging the cathode.

In this process, the region to be irradiated by the laser is limited to the pixels for which darkening is desired by placing a mask immediately in front of the glass substrate 30 (the mask may be in contact with the glass substrate 30). However, if the irradiation area of the laser can be reliably limited by an optical system, the laser irradiation area may be limited by the optical system. In addition, the laser irradiation is required only in the region in which light is emitted. Therefore, it is desirable to limit the irradiation area of the laser to the region where the organic emissive layer 54 is present. In general, no organic emissive layer 54 is formed in a region in which the TFT is present. Therefore, by limiting the laser irradiation area to the region where the organic emissive layer 54 is present, it is possible to avoid laser irradiation to the TFT. Because the TFTs comprise an active layer of low temperature polycrystalline silicon, laser irradiation to the TFTs is not desirable and, thus, it is also desirable not to irradiate the TFTs with the laser. Moreover, even when the organic emissive layer 54 is present above the TFTs, it is preferable to employ a configuration such that the TFTs are not irradiated with the laser.

[Attenuation of Light in Pixel]

A defective pixel can be darkened through the process described above. When such a darkening process is performed, however, the cathode may be damaged in some cases. More specifically, in some organic EL panels, it may not be possible to select a condition that allows reliable darkening without damaging the cathode.

In such cases, a condition is selected that allows attenuation but not darkening. In other words, a condition in which the amount of emission is not 0, but the brightness is very low and the pixel is substantially dark is selected.

Figure 3:
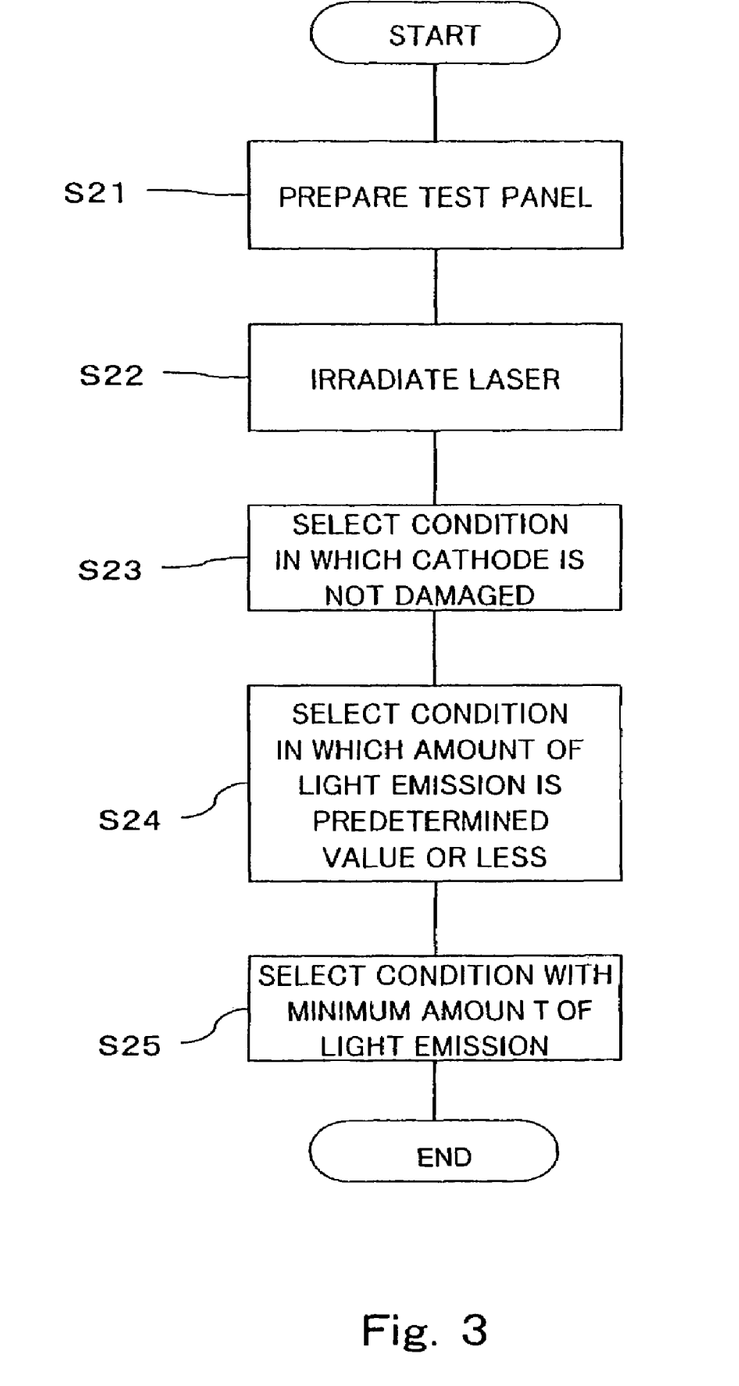
FIG. 3 is a flowchart showing another example process of setting an amount of irradiation of laser.

For example, as shown in FIG. 3, a test panel is prepared (S21) and laser light is irradiated to a plurality of pixels while the amount of irradiation is varied (S22). Conditions in which the cathode is not damaged are selected (S23). Among the selected conditions, one or more conditions wherein the amount of emission is less than or equal to a predetermined value are selected (S24). When a plurality of conditions are selected in this step, a condition where the amount of emission is minimized is selected (S25).

In this manner, the bright point defective pixel can be attenuated. The attenuated defective pixel still emits light, but the amount of emission is so low that the emission cannot be recognized in normal use. In other words, the pixel becomes so dark that although the pixel can be viewed in a completely dark room, the pixel cannot be seen in an environment having more than a certain degree of brightness. The degree of darkness depends on the size of a pixel and when the sides of a pixel are each several tens of micrometers long, the pixel becomes unrecognizable with a light emission of approximately 20% or less. For this purpose, attenuation to a degree in which the pixel is recognized as a dark point in an experiment using an ND filter suffices and the attenuation may be to a degree in which the pixel is recognized as a low brightness point.

As described, according to the present embodiment, for a bright point defective pixel, the amount of light emission is reduced. With such a structure, it is possible to reliably prevent generation of damages to the cathode and process the defective pixel.

[Attenuation of a Portion of a Pixel]

In the configuration exemplified above, the entire light emitting section is attenuated. However, as a result of study of generation of damage to the cathode, it has been found that damage in the section of the cathode corresponding to the ends of the anode is significant. As shown in FIG. 1, in the section corresponding to the ends of the anode 50, the shapes of the layers change in a complicated manner. It can be considered that, because of this complication, the light that reaches the cathode 58 when laser is irradiated becomes non-uniform, a portion of the light becomes more intense, and damage tends to occur.

Figure 4:
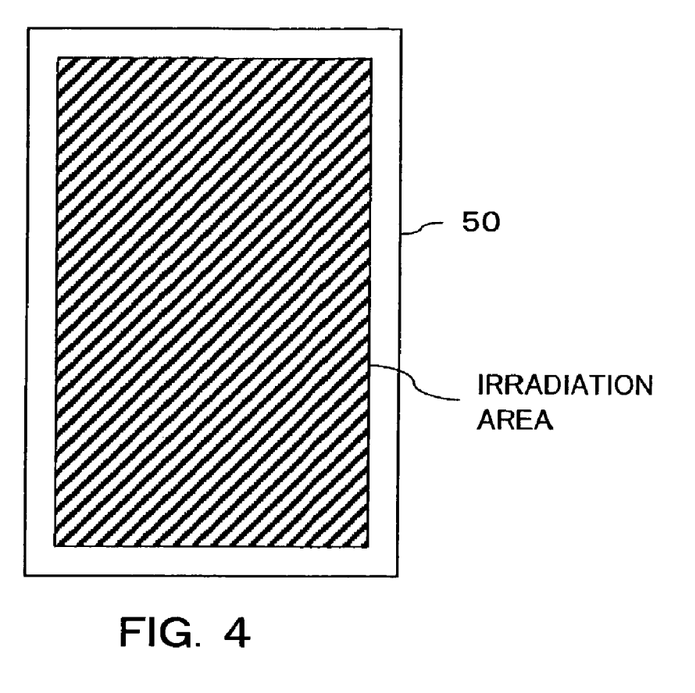
FIG. 4 is a diagram showing an example of a region of irradiation of laser.

To this end, in the present embodiment, laser light is irradiated avoiding the peripheral sections of the anode 50. That is, as shown in FIG. 4, the laser light is irradiated in an area which is smaller than the anode 50, more specifically, an area smaller than the emissive region formed in a region where the anode 50 and the cathode 58 oppose each other with at least the emissive layer 54 therebetween. With such a configuration, it is possible to effectively avoid generation of damage to the cathode 58.

Figure 5:
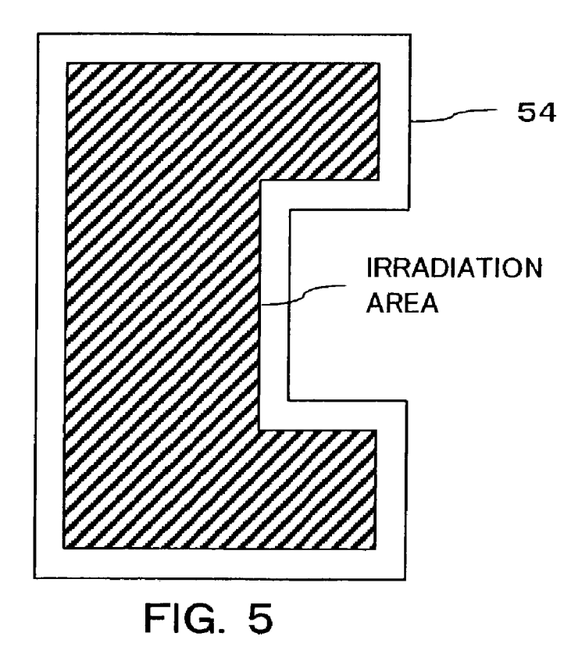
FIG. 5 is a diagram showing another example of a laser irradiation region.

When there is a recessed section in the cross sectional shape of the emissive layer 54, the recessed section need not be irradiated. In addition, various shapes are known for the anode. Therefore, as shown in FIG. 5, it is possible to set the laser irradiation area to conform to the shapes of the emissive layer and the anode.

In addition, when the irradiation area is limited by a mask or the like, it is not desirable to employ a complicated shape. Therefore, as shown FIG. 6, it is possible to set a unit irradiation area which is relatively small and perform attenuation of the emissive region with a plurality of bursts of laser radiation. In this manner, by reducing the unit irradiation area, it is possible to flexibly respond to any change in the shape of the irradiation area and to increase the generality of the repair device.

As described, according to the present embodiment, an attenuation process is not applied to the entire emissive region, and a region which is not attenuated remains in the periphery of the emissive region. However, the area of this region is small, and, consequently, light emission from this region is also small. In particular, emission from the central section of the emissive region is suppressed. As a result, the brightness of the overall pixel is very low and it is very difficult to recognize the pixel. With such attenuation, it is possible to effectively attenuate a bright point defective pixel while reliably preventing generation of damages to the cathode.

Figure 7:
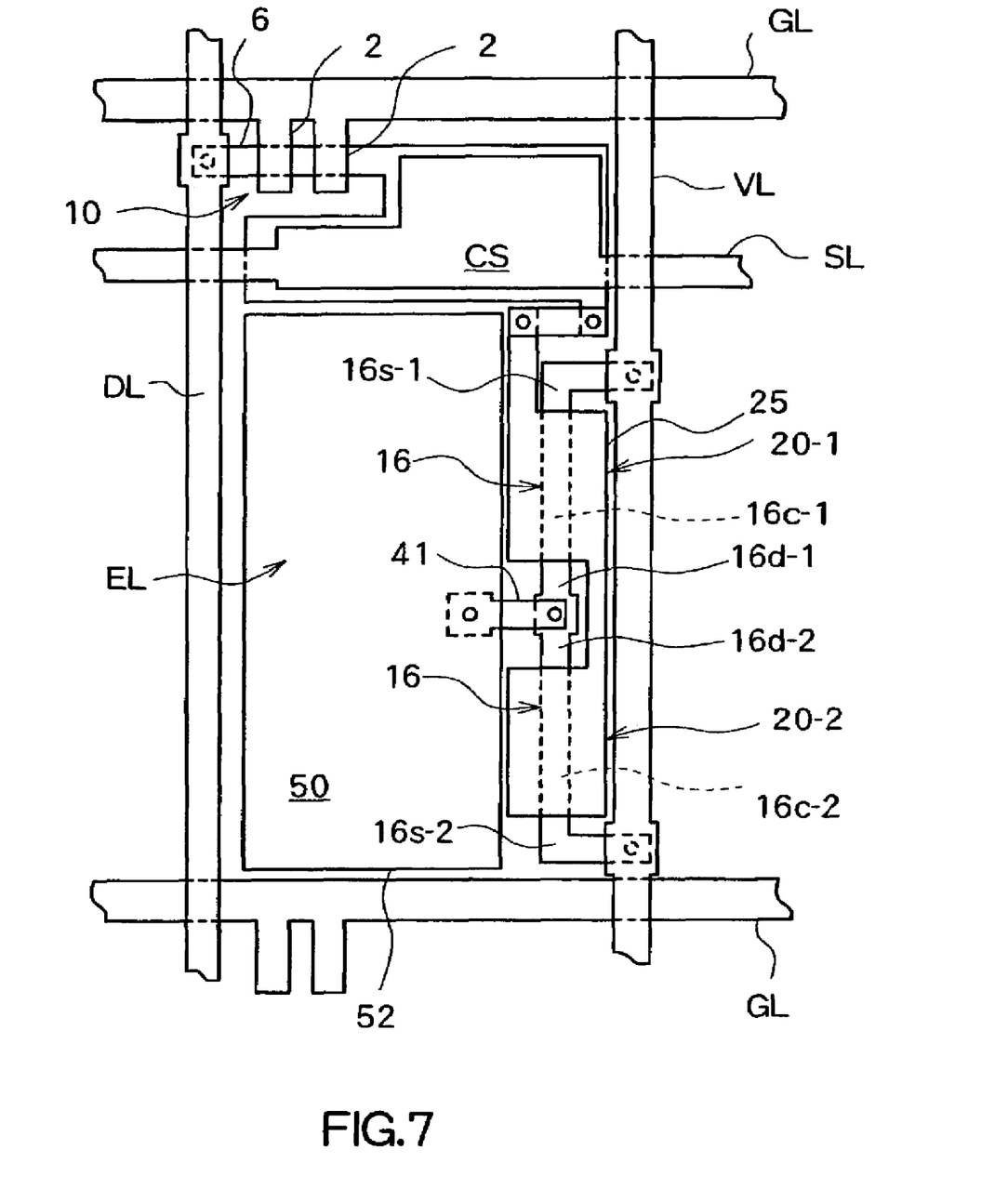
FIG. 7 is a diagram showing a planar structure of a pixel.

FIG. 7 shows a planar structure of a pixel of an organic EL panel. A gate line GL extends in the horizontal direction and one or more gates 2 of a first TFT 10 is connected to the gate line GL. The first TFT 10 is of a double gate type in which two gates 2 are provided. One end (source) of an active layer 6 of the first TFT 10 is connected to a data line DL. The other end of the active layer 6 is connected to a lower electrode of a capacitor CS, or, alternatively, also functions as a lower electrode of a capacitor CS. The sections of the active layer 6 below the gates 2 of the first TFT 10 form channel regions, a section of the active layer 6 between the two gates 2 forms a drain-source region, and a section of the active layer 6 connected to the lower electrode of the capacitor CS form a drain region.

An upper electrode (which is provided approximately in the same layer as the gate electrode) is placed opposing the lower electrode of the capacitor CS with a silicon oxide film therebetween. The capacitor CS is formed of the lower electrode, dielectric layer, and upper electrode. The upper electrode of the capacitor CS is connected to a capacitor line SL which is maintained at a low potential.

Therefore, when the gate line GL becomes high (H level), the first TFT 10 is switched on and the potential of the data line DL is written to the capacitor CS (the capacitor is charged).

The lower electrode of the capacitor CS is connected to a gate 25 of a second TFT 40. The second TFT 40 comprises two second TFTs 20-1 and 20-2 connected in parallel with the ends functioning as sources and the central section functioning as a drain. The second TFT 40 comprises an active layer 16 with sources 16s-1 and 16s-2 on the ends of the active layer 16 connected to a power supply line VL. The sections below the gates 25 form the channels 16c-1 and 16c-2 and the central sections form drains 16d-1 and 16d-2.

The drains 16d-1 and 16d-2 are connected to an organic EL element EL by a wiring 41. That is, the drains 16d-1 and 16d-2 of the second TFTs 20-1 and 20-2 shown in FIG. 7 are connected to an anode 50 of the organic EL element EL.

With a pixel having such a structure, it is possible to darken a pixel by irradiating an UV laser while avoiding the peripheral section of the anode 50, as described above.

[Process when Foreign Body is Adhered]

A plurality of organic layers and the cathode 58 in an organic EL element EL may be formed through deposition using a metal mask. When this process is employed, a foreign body may adhere in the formation region of the organic EL element EL. Such a foreign body may cause shorting of the anode 50 and the cathode 58, resulting in inability to supply a drive current through the organic EL element EL.

To address this problem, laser light having a predetermined wavelength (for example, 1064 nm) is conventionally irradiated in such a manner as to burn the foreign body while emitting light from the surrounding pixel regions in a normal manner except for the pixel to which laser is irradiated. However, there is a problem in that, when the laser light irradiation to the foreign body is not properly performed, damage may be caused to the cathode 58 or the like by the laser energy. For example a pinhole may be created in the element section of the organic EL element. When a pinhole is created, moisture may enter the inside of the element and causes degradation in the characteristics of the element, resulting in a display defect commonly referred to as a "dark spot".

Figure 8:
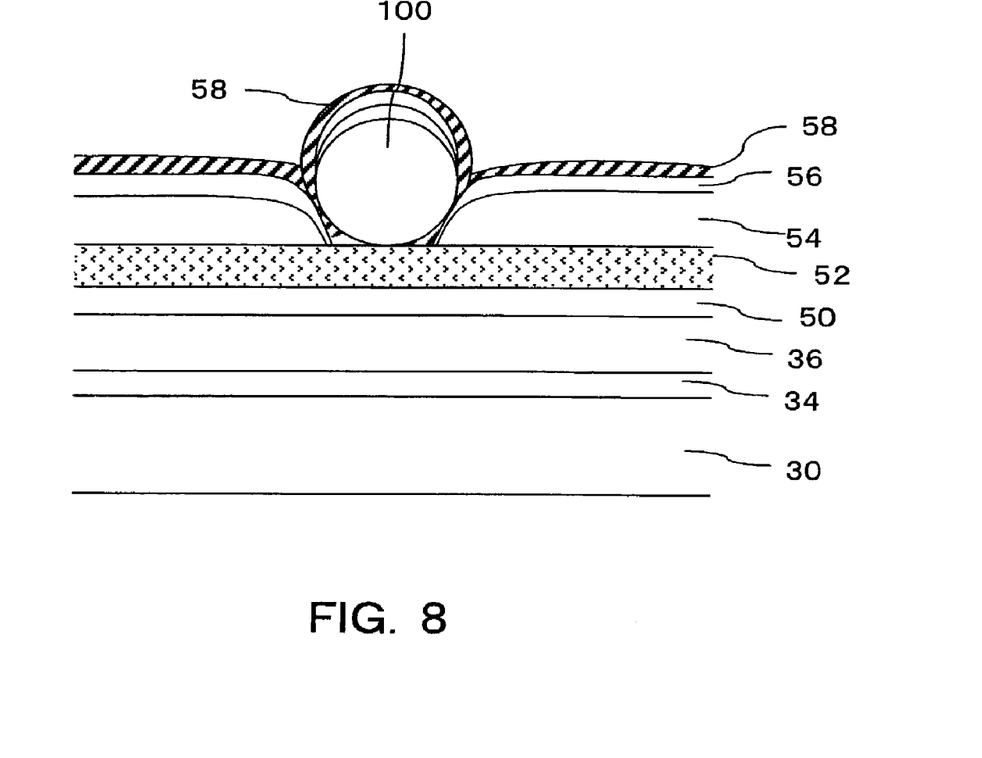
FIG. 8 is a cross sectional diagram showing a condition in which a foreign matter is adhered.

In the present embodiment, a laser repairing process is performed as follows. An example case is described wherein it has been detected that a foreign body 100 is adhered to an organic EL element EL in a pixel as shown in FIG. 8. Example methods for detecting the foreign body include, for example, manual observation through a microscope and automatic detection using a foreign body examination device.

Figure 9:
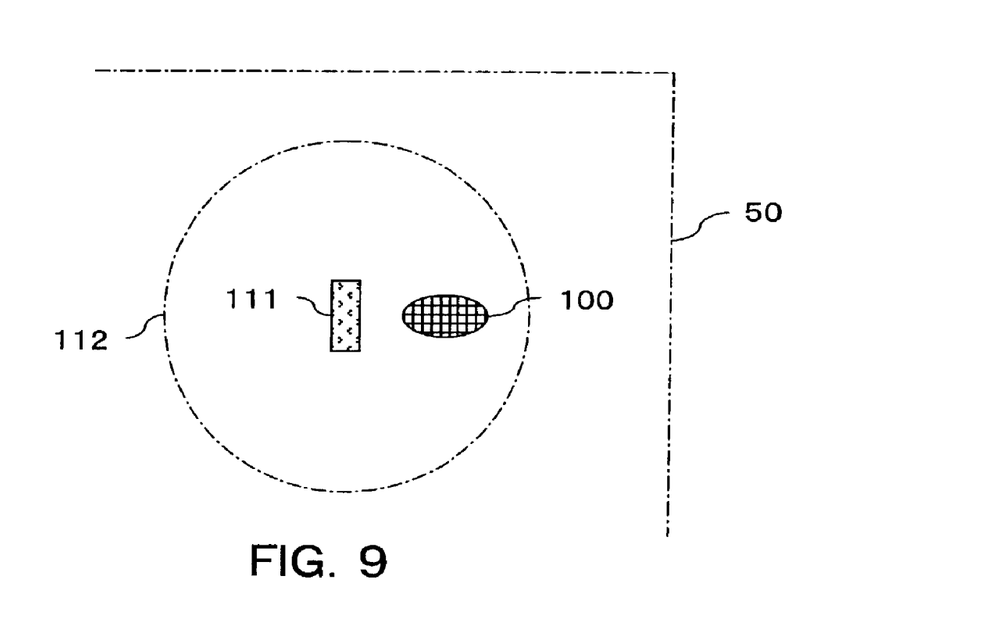
FIG. 9 is a plane diagram showing a condition in which a foreign matter is adhered.

In the present embodiment, instead of directly irradiating the foreign body 100 with laser light, as shown in FIG. 9, an irradiation region 111 is set in the peripheral region of the foreign body 100 and laser is irradiated. In this manner, by irradiating laser in the peripheral region distant from the foreign body 100, the energy of the laser is transmitted concentrically with the irradiation region 111 as the center and is indirectly supplied to the foreign body 100. Therefore, by irradiating laser to the irradiation region 111, the organic matter becomes highly resistive in a highly-resistive region 112 shown by a dotted line in FIG. 9. As a result, it is possible to form a high resistance region between the anode 50 and the cathode 58 and to repair a shorting defect by the foreign body 100.

In particular, in the present embodiment, because it is only required to irradiate laser for increasing the resistance of the organic layer, it is possible to prevent damages to the organic EL element EL to which the foreign body 100 is adhered and prevent consequent generation of the pinholes in the cathode 58. The formation of a high resistance region by the laser irradiation can be considered as being caused by fusion of the hole transport layer 50, the emissive layer 52, and the electron layer 54 by the thermal energy of the laser light and consequent loss of the layered structure.

As the laser, for example, a commercially available YAG laser (for example, having a laser wavelength of 355 nm) can be used, with the irradiation region 111 of, for example, 5 μm×5 μm. The size of the foreign body 100 is 0.3 μm to 10 µm. It is preferable that the irradiation region 111 be 5 µm to 10 µm away from the foreign body 100.

Figure 10:
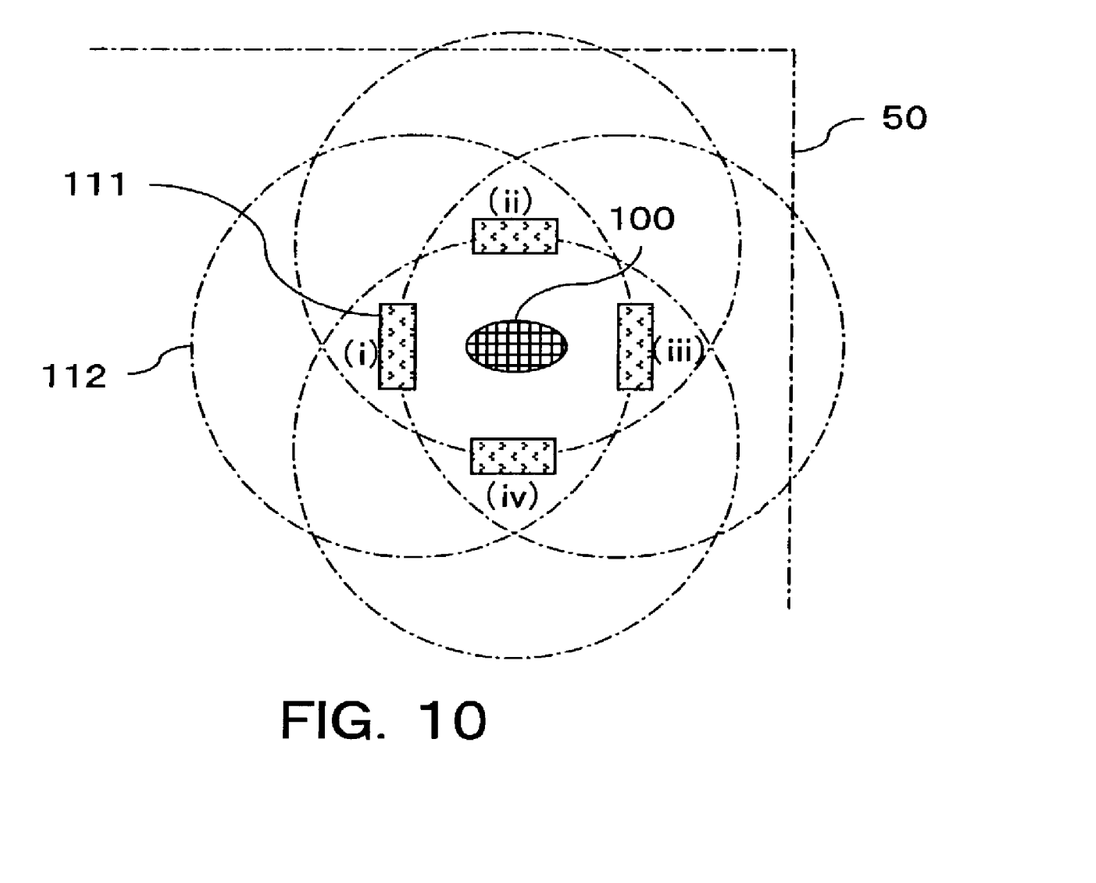
FIG. 10 is a diagram showing a process for a large foreign matter.

When the size of the foreign body 100 is 3 µm or greater, it may be preferable to irradiate four bursts of laser light as shown in FIG. 10 (regions (i) to (iv) in FIG. 10) in peripheral regions above, below, to the right of, and to the left of the foreign body 100 in order to supply sufficient energy to the region of the foreign body. It may also be preferable that the number of bursts be suitably increased or decreased depending on the size of the foreign body 100.

The wavelength of the laser to be irradiated may be suitably selected in a range shorter than 532 nm as described because such a configuration allows for the repairing process without damaging the organic EL element, and lasers of, for example, 355 nm and 308 nm are particularly preferable.

[Darkening by Electric Current]

In the embodiment described above, a defective pixel is irradiated with laser light so that the characteristics of the organic layer are altered, the light emission capability of the organic EL element is reduced, and attenuation of the pixel is achieved.

In the present embodiment, on the other hand, a large current which is larger than a rated current is supplied to the organic EL element of a bright point defective pixel to alter the characteristics of the organic layer of the defective pixel, degrade the light emission capability of the organic EL element, and achieve attenuation of the pixel.

More specifically, a power supply having a high voltage and high current supply capability is connected to the power supply line VL shown in FIG. 7. With such a configuration, the first TFT 10 of the defective pixel is selectively switched on so that a large current is supplied to the organic EL element EL of the pixel. In this manner, the organic layer of the organic EL element EL can be degraded and attenuation of the pixel can be achieved.

In an organic EL panel, the organic EL element is degraded with long term use. When a current larger than a rated current is supplied, the organic EL element is more rapidly degraded. In particular, by maintaining a fully "switched on" condition for a defective pixel, the temperature of the organic EL element of that pixel is increased and the organic EL element is very rapidly degraded. By purposefully employing these factors, it is possible to attenuate the pixel by controlled degrading of the organic EL element.

When this is done, complete darkening is not necessary and the degradation may be performed so that the light emission is reduced to a predetermined extent.

In the above-described embodiments, darkening (or attenuation) of the defective pixel is performed by laser irradiation. The laser irradiation, however, is not limited to such a usage, and may also be applied for attenuation of other selected regions.

For example, in an organic EL panel, an organic EL element is provided for each pixel and light emission is controlled for each pixel. However, there are some cases where light is emitted at an undesired region because of deviation in the formation step of the organic layer of the organic EL element or the like. In particular, when there is a fault in the organic emissive layer, light of a color other than that intended may be emitted or light may be emitted from the electron transport layer of a region from light which should not be emitted.

In these cases where light is emitted from an undesired region, it is possible to irradiate this region with laser light as described above to alter the characteristics of the organic layer and attenuate light in that portion. With such a configuration, it is possible to prevent undesirable light emission.

In addition, in an organic EL panel, in some cases, a pattern commonly known as a black stripe is formed wherein a black filter is placed in a region which separates the pixels, in order to improve the contrast. By irradiating laser for attenuating according to a pattern similar to the black stripe pattern, it is possible to form the black stripe pattern through alteration of the characteristics of the organic layer. In addition, such attenuation in undesired regions is also desirable for separating pixels in a simple or passive matrix organic EL panel. As the mechanism, an alteration of characteristics in the organic layer, an alteration of characteristics in the interface between organic layers, an alteration of characteristics in the interface between an organic layer and an electrode, etc. can be considered.

As described, according to the present embodiment, by selectively irradiating laser light on organic layers in a defective region, attenuation in the region can be achieved. During the laser irradiation, the organic layer is irradiated for attenuation, which is different from a process of severing wiring using a laser. Therefore, it is possible to prevent damages to the cathode and to achieve attenuation in the bright point defective pixel without any adverse effect caused by damage to the cathode.

In addition, the peripheral region of the emissive region is a region wherein the thickness or the like varies and the laser irradiation to such regions tends to become non-uniform, resulting in a higher tendency for damage to the cathode to occur. Therefore, by not irradiating the peripheral region of the emissive region with the laser, it is possible to reliably prevent damage to the cathode.

What is claimed is:

1. A laser processing method in an organic EL panel in which a plurality of pixels each comprising an organic EL element are arranged in a matrix form, wherein the method comprises an attenuation process including:
    irradiating a peripheral region of a foreign body adhered to the organic EL element with laser light to make an organic layer of the organic EL element to which the foreign body is adhered highly resistive; and
    altering characteristics of organic matter in the organic layer by irradiation of laser to the organic layer and increasing the resistance of the organic layer without removing the organic layer.

2. A method according to claim 1, wherein
    the laser irradiation is performed in a plurality of bursts in the peripheral regions of the foreign body.

3. A method according to claim 1, wherein the wavelength of the laser light is 532 nm or less.

4. A method according to claim 1, wherein a cathode of the organic EL element is not damaged during the attenuation process and laser is selectively irradiated to a region in which the organic emissive layer is present.

5. A method according to claim 1, wherein a short-circuited portion of the organic layer where the foreign body is adhered is short-circuited and the short circuited portion is not removed.

* * * * *